(12) United States Patent
Ramanujan et al.

(10) Patent No.: US 9,418,700 B2
(45) Date of Patent: Aug. 16, 2016

(54) BAD BLOCK MANAGEMENT MECHANISM

(75) Inventors: Raj K. Ramanujan, Federal Way, WA (US); Glenn J. Hinton, Portland, OR (US); David J. Zimmerman, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/537,969

(22) Filed: Jun. 29, 2012

(65) Prior Publication Data

US 2014/0006848 A1    Jan. 2, 2014

(51) Int. Cl.
   *G11C 29/00*    (2006.01)
   *G11B 20/18*    (2006.01)

(52) U.S. Cl.
   CPC ............ *G11B 20/1883* (2013.01); *G11C 29/82* (2013.01); *G11C 29/886* (2013.01)

(58) Field of Classification Search
   CPC ................ G11B 20/1883; G11C 29/76; G06F 2212/7209; G06F 2212/7201
   USPC .......................................... 714/710; 711/203
   See application file for complete search history.

(56) References Cited

U.S. PATENT DOCUMENTS

| 8,612,676 | B2 | 12/2013 | Dahlen et al. |
| 2009/0013148 | A1 | 1/2009 | Eggleston |
| 2009/0063934 | A1* | 3/2009 | Jo .................... 714/764 |
| 2009/0198906 | A1* | 8/2009 | Armilli et al. ................ 711/137 |
| 2010/0146239 | A1 | 6/2010 | Gabai et al. |
| 2010/0325343 | A1 | 12/2010 | Takashima |
| 2011/0099324 | A1* | 4/2011 | Yeh .................... 711/103 |
| 2011/0161784 | A1* | 6/2011 | Selinger et al. ............... 714/768 |
| 2012/0005451 | A1* | 1/2012 | Lee et al. ...................... 711/203 |
| 2012/0124304 | A1 | 5/2012 | Asnaashari et al. |
| 2013/0073895 | A1* | 3/2013 | Cohen ........................... 714/6.2 |
| 2013/0268725 | A1 | 10/2013 | Faber |
| 2013/0282967 | A1 | 10/2013 | Ramanujan |

FOREIGN PATENT DOCUMENTS

| KR | 10-2009-0129096 | 12/2009 |
| WO | 2013/048493 A1 | 4/2013 |
| WO | 2013/048497 A1 | 4/2013 |
| WO | 2013/048500 A1 | 4/2013 |
| WO | 2013/048503 A1 | 4/2013 |

OTHER PUBLICATIONS

PCT Search Report and Written Opinion, PCT/US2013/043894, Nov. 14, 2013, 5 pages.
International Preliminary Report on Patentability and Written Opinion, PCT/US2013/043894, mailed Jan. 8, 2015, 9 pages.
Examination Report from related European Application No. GB1421154.4, mailed Jul. 30, 2015, 2 pages.

* cited by examiner

*Primary Examiner* — Sam Rizk
(74) *Attorney, Agent, or Firm* — Blakely, Sokoloff, Taylor & Zafman LLP

(57) ABSTRACT

A system includes a non-volatile random access memory (NVRAM) device and controller logic that detects a bad block within the device, retires the bad block and replaces the bad block with a replacement block by assigning the address of the bad block to the replacement block.

19 Claims, 5 Drawing Sheets

BAD BLOCK MANAGEMENT MECHANISM

FIELD OF THE INVENTION

The present disclosure generally relates to the field of electronics. More particularly, some embodiments of the invention generally relate to bad block management for block oriented non-volatile memory.

BACKGROUND

As processing capabilities are enhanced in processors, one concern is the speed at which memory may be accessed by a processor. For example, to process data, a processor may need to first fetch data from a memory. After completion of the processing, the results may need to be stored in the memory. Therefore, the memory speed can have a direct effect on overall system performance.

Another important consideration is power consumption. For example, in mobile computing devices that rely on battery power, it is very important to reduce power consumption to allow for the device to operate while mobile. Power consumption is also important for non-mobile computing devices as excess power consumption may increase costs (e.g., due to additional power usage, increasing cooling requirements, etc.), shorten component life, limit locations at which a device may be used, etc.

Hard disk drives provide a relatively low-cost storage solution and are used in many computing devices to provide non-volatile storage. Disk drives however use a lot of power when compared to flash memory since a disk drive needs to spin its disks at a relatively high speed and move disk heads relative to the spinning disks to read/write data. All this physical movement generates heat and increases power consumption. To this end, some higher end mobile devices are migrating towards flash memory devices that are non-volatile. However, flash memory has a number of drawbacks including, for example, relatively large voltage level requirement to change bit states, delay in write times due to requirement of a charge pump ramp up, having to erase a block of cells at a time, etc Phase Change Memory (PCM) is another type of non-volatile memory that may provide higher performance and/or endurance when compared to a flash memory device. For example, PCM allows a single bit to be changed without needing to first erase an entire block of cells, PCM structure may degrade more slowly, PCM data state may be retrained for a relatively longer period, and PCM is more scalable.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Some embodiments relate to management and/or support of metadata for non-volatile random access memory (NVRAM) devices, such as Phase Change Memory (PCM) PCM devices. The embodiments discussed herein are however not limited to PCM and may be applied to any type of write in-place non-volatile memory (e.g., Phase Change Memory Switch (PCMS)). Accordingly, the terms "PCMS" and "PCM" may be interchangeable herein. PCMS is comprised of one PCM element layered with a newly used Ovonic Threshold Switch (OTS) in a true cross point array. The ability to layer or stack arrays of PCMS provides the scalability to higher memory densities while maintaining the performance characteristics of PCM. In other embodiments, the concepts disclosed herein may be applied to other non-volatile memory devices (e.g., ferroelectric transistor random access memory (FeTram), nanowire, etc.).

PCM devices exploit the behavior of chalcogenide glass, such that heat produced by passage of an electric current that switches this material between crystalline and amorphous states. In an embodiment, PCM device accesses are translated through an Address Indirection Table (AIT). In some embodiments, specific uses of PCM improve the performance of storage solutions using the unique capabilities provided by PCM (e.g., its load/store capabilities). For example, in a hybrid storage device, PCM is used for metadata storage, while the relatively cheaper NAND memory is used for data storage.

Figure 1:
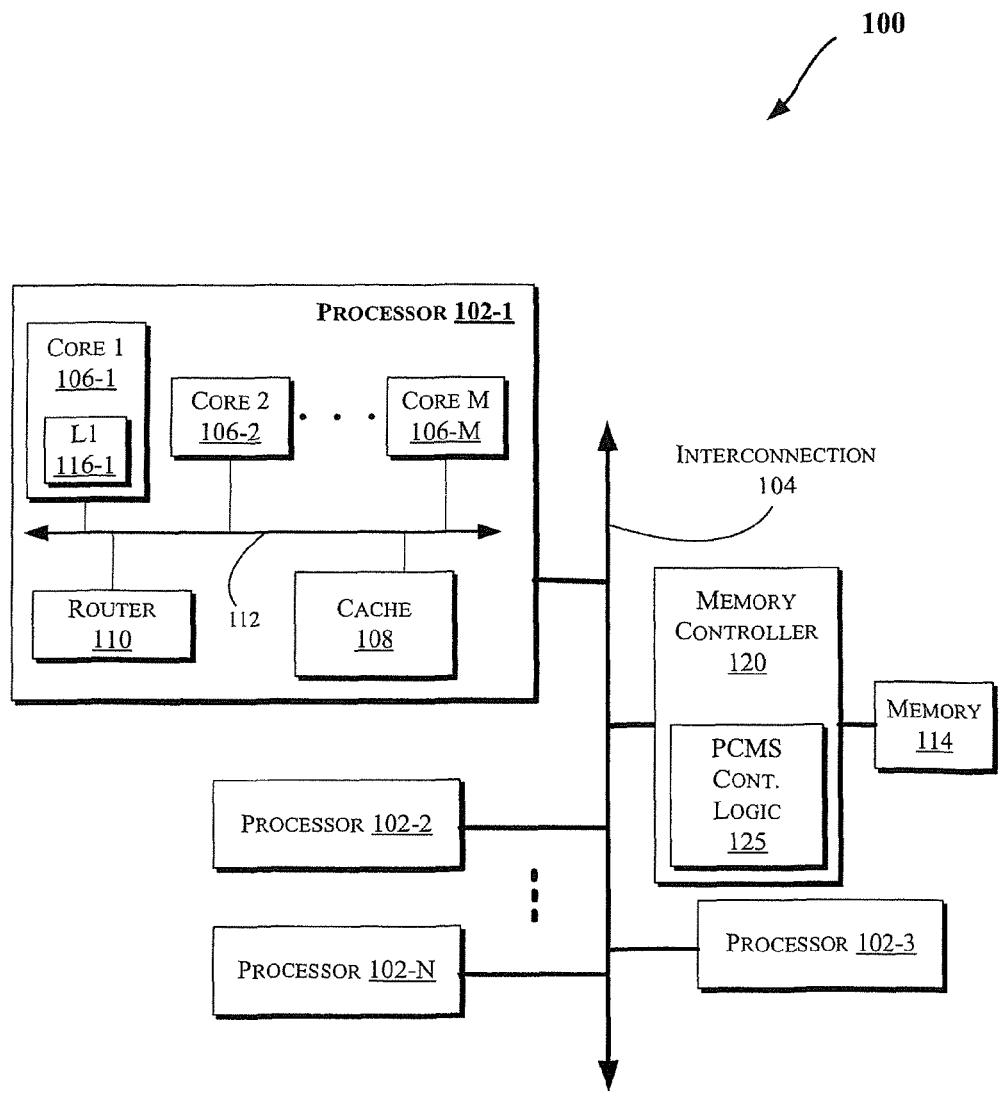
FIGS. 1, 4, and 5 illustrate block diagrams of embodiments of computing systems, which may be utilized to implement various embodiments discussed herein.

Moreover, the memory techniques discussed herein may be provided in various computing systems (e.g., including smart phones, tablets, portable game consoles, Ultra-Mobile Personal Computers (UMPCs), etc.), such as those discussed with reference to FIGS. 1-5. More particularly, FIG. 1 illustrates a block diagram of a computing system 100, according to an embodiment of the invention. The system 100 may include one or more processors 102-1 through 102-N (generally referred to herein as "processors 102" or "processor 102"). The processors 102 may communicate via an interconnection or bus 104. Each processor may include various components some of which are only discussed with reference to processor 102-1 for clarity. Accordingly, each of the remaining processors 102-2 through 102-N may include the same or similar components discussed with reference to the processor 102-1.

In an embodiment, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), memory controllers (such as those discussed with reference to FIGS. 4 and 5), or other components.

In one embodiment, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that are utilized by one or more components of the processor 102-1, such as the cores 106. For example, the cache 108 may locally cache data stored in a memory 114 for faster access by the components of the processor 102. As shown in FIG. 1, the memory 114 may be in communication with the processors 102 via the interconnection 104. In an embodiment, the cache 108 (that may be shared) may have various levels, for example, the cache 108 may be a mid-level cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 1, memory 114 may be coupled to other components of system 100 through a memory controller 120. In one embodiment, memory 114 includes two levels of memory (2LM) having cached subsets of system disk level storage (in addition to, for example, run-time data). Memory 114 includes a first level (alternatively referred to herein as "near memory") comprising smaller faster memory made of, for example, DRAM; and a second level (alternatively referred to herein as "far memory") which comprises larger and slower (with respect to the near memory) volatile memory (e.g., DRAM) or nonvolatile memory storage (e.g., flash memory).

In such an embodiment, memory 114 may include nonvolatile memory such as PCM memory in some embodiments. Even though the memory controller 120 is shown to be coupled between the interconnection 102 and the memory 114, the memory controller 120 may be located elsewhere in system 100. For example, memory controller 120 or portions of it may be provided within one of the processors 102 in some embodiments. Also in some embodiments, system 100 may include logic (e.g., PCM controller logic 125) to issue read or write requests to the memory 114 in an optimal fashion.

In some embodiments, PCM is addressable as memory but due to its device specific characteristics of limited write endurance, read drift, etc., PCM devices may require remapping of the software generated System Memory Address (SMA) to a Non-Volatile Memory Address (NVMA) (also referred to herein as an PCM address). An Address Indirection Table (AIT) is used in an embodiment to implement this remapping by via a controller (e.g., logic 125 of FIG. 1). In one embodiment, each entry in the AIT includes the NVM address that corresponds to the system memory address being remapped and metadata information (e.g., provided by software). The information stored in the AIT is accessed by the logic 125 to provide optimal management of the PCM device.

Figure 2:
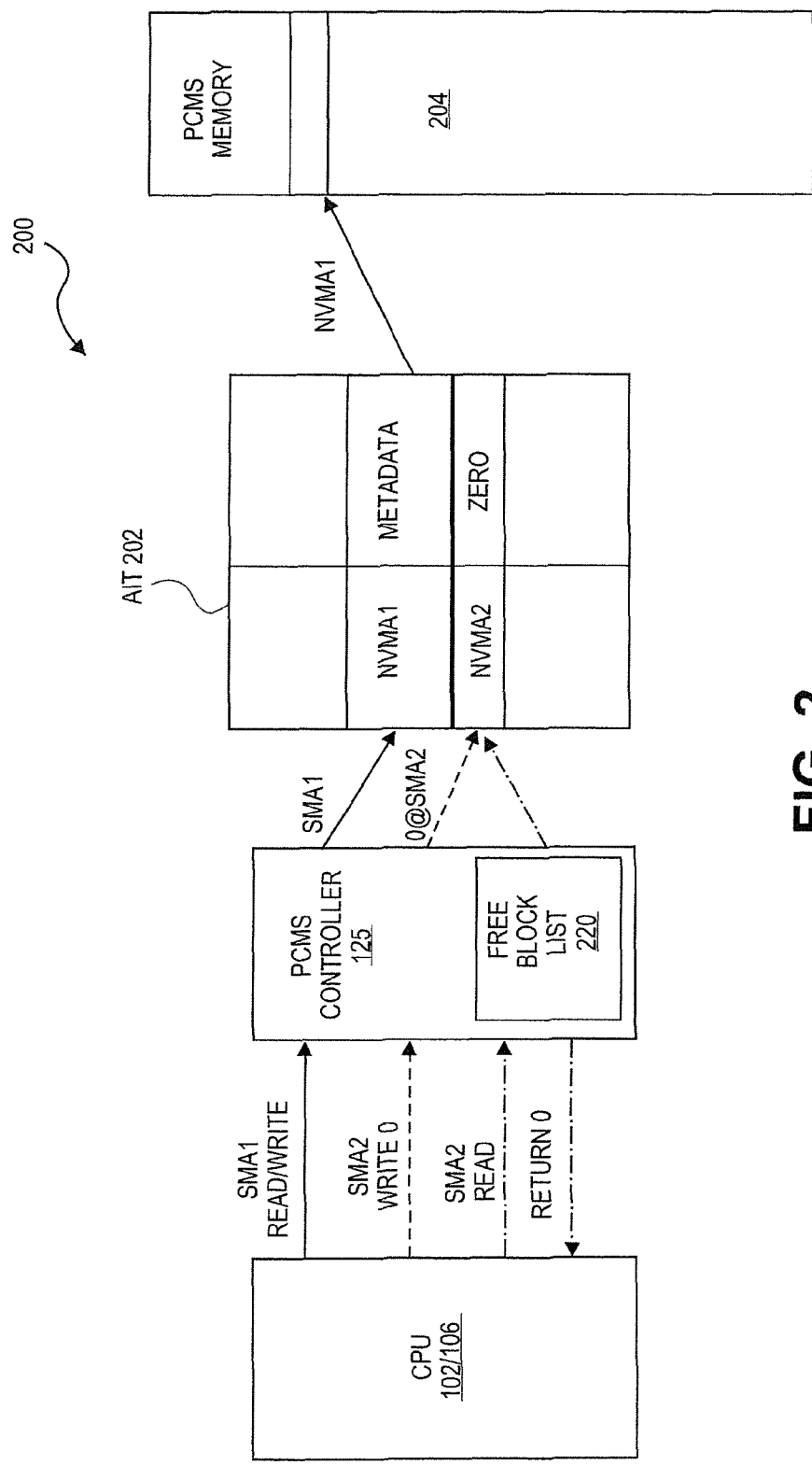
FIG. 2 illustrates a block diagram of components that may be used to translate between SMA and PCM addresses, according to some embodiments.

FIG. 2 illustrates a block diagram of components 200 that may be used to translate between SMA and PCM addresses, according to some embodiments. As shown, a remap accessing NVM (SMA1) with metadata is shown in comparison with a remap of access to SMA2 write with "0" metadata and read to the same (SMA2) that avoids access to NVM/PCM memory 204.

In one embodiment, NVM/PCM memory 204 is sub-divided into blocks and sub-blocks. In such an embodiment, the sub-blocks are the access granularity for read and write accesses. In a further embodiment, ECC (Error Correcting Code) is maintained at the sub-block level, such that the sub-block is striped across multiple devices, with an exclusive-or (XOR) value of the being is stored in yet another device. Thus whenever a sub-block is read, ECC check is performed on for the sub-block. If there is an uncorrectable error, the XOR contents are used for recovery.

In one embodiment, the metadata may be provided by software using a new Instruction Set Architecture (ISA) or alternatively deduced from a current Instruction Set Architecture. The metadata information may be transmitted from CPU 102 (also referred to herein interchangeably as "processor") to the PCM controller logic 125 that remaps addresses using AIT 202. The metadata may provide the logic 125 with some semantics about the data at the NVM/PCM address which it may use to make more optimal decisions about device management.

A problem exists with the implementation of NVM/PCM as memory 204 in a two-level memory hierarchy since PCM has a reasonably high failure rate. According to one embodiment, controller logic 25 provides a mechanism for managing bad blocks in memory 204. In such an embodiment, memory 204 sub-blocks that exhibit recoverable, or a large number, of are isolated so that a failing block can be identified prior to its contents becoming unrecoverable.

In one embodiment, contents of a block are copied to another block in memory 204 before the block is retired. Subsequently, the replacement block is assigned the original system address for the retired block. Accordingly, the moving of a failing block to a different block is very similar to a flash device wear-level move, with the difference being that the sub-block is retired and cannot be re-used.

According to one embodiment, controller logic 125 includes a free block list 220, which is implemented to select the replacement block location. Free block list 220 maintains a set of free PCM blocks that is continually filled to make up for block that have been retired for wear level or bad block move. In one embodiment, the free blocks are additional blocks for which system software does not have access. Thus, the total number of blocks seen by the system software will remain constant. The retired bock is moved into a bad block list and can't be re-used.

In a further embodiment, the contents of a block that has been worn out due to overuse may also be moved to a new PCM block from free block list 220. In one embodiment, controller logic 25 may choose new blocks to enter the list using a random algorithm. However other embodiments may use one of a variety of different approaches.

Figure 3:
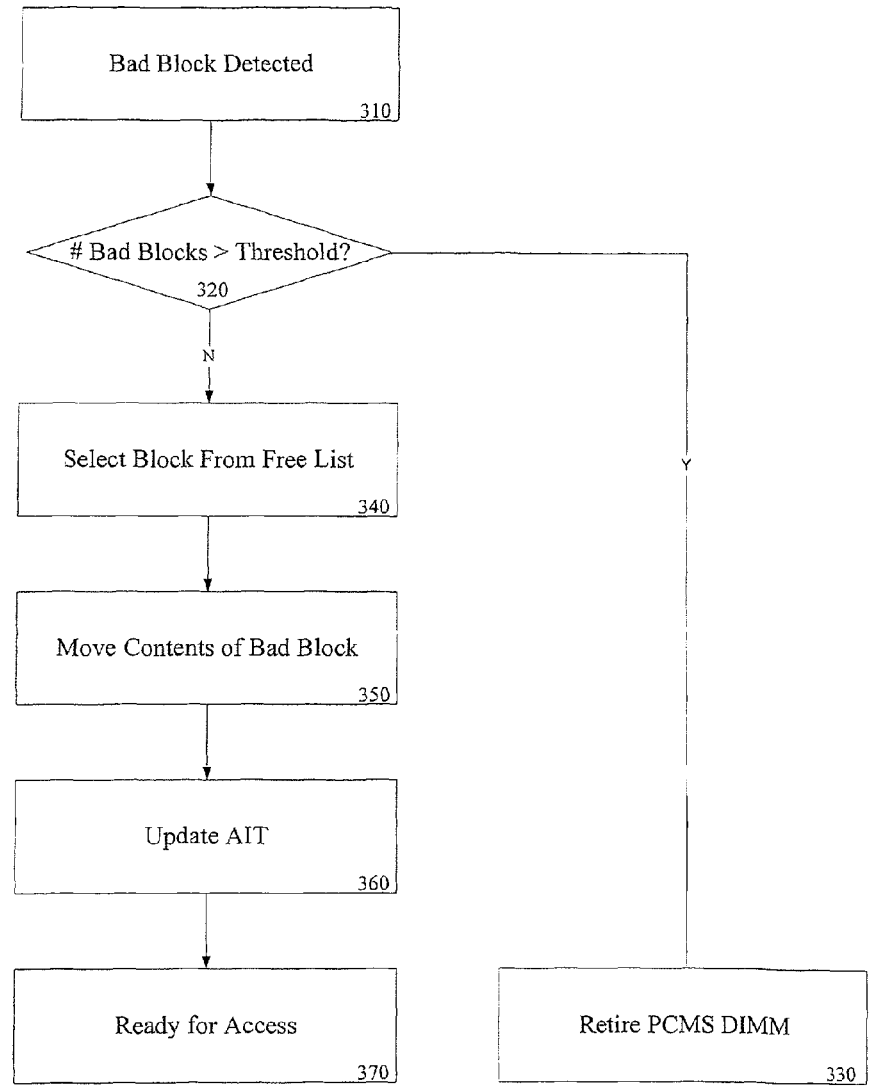
FIG. 3 is a flow diagram illustrating one embodiment of bad block management.

FIG. 3 is a flow diagram illustrating one embodiment of a process implemented by controller logic 125 to perform bad block management. At processing block 310, a bad block is detected. According to one embodiment, various policies may be used to determine if a block has gone bad and needs to be retired. For instance, a block may be deemed to be bad if a number of ECC errors has exceeded a predetermined threshold, a hard failure has been detected or based on error conditions from the PCM (e.g., heat statistics). In an alternative embodiment, a block may be considered bad after predetermined number of accesses. In such an embodiment, controller logic 125 tracks the number of accesses to each block and swaps a block having a high access count having a block with a lower access count upon a number of accesses reaching a predetermined threshold. This may be accomplished by moving high wear blocks through free block list 220 or by direct swapping of the high and low wear blocks.

At decision block 320, it is determined whether a number of bad blocks in the PCM DIMM at which the block resides have exceeded a predetermined threshold. If so, DIMM is immediately retired, processing block 330. Otherwise, a replacement block is selected from free block list 220, processing block 340. At processing block 350, the contents of the retired block are moved into the replacement block.

At processing block 360, AIT 202 is updated to point the system address to the replacement block address. At processing block 370, the replacement block is available to be accessed. The above-described mechanism enables the remapping of blocks in a PCM memory subsystem by making use of an Address Indirection Table.

Figure 4:
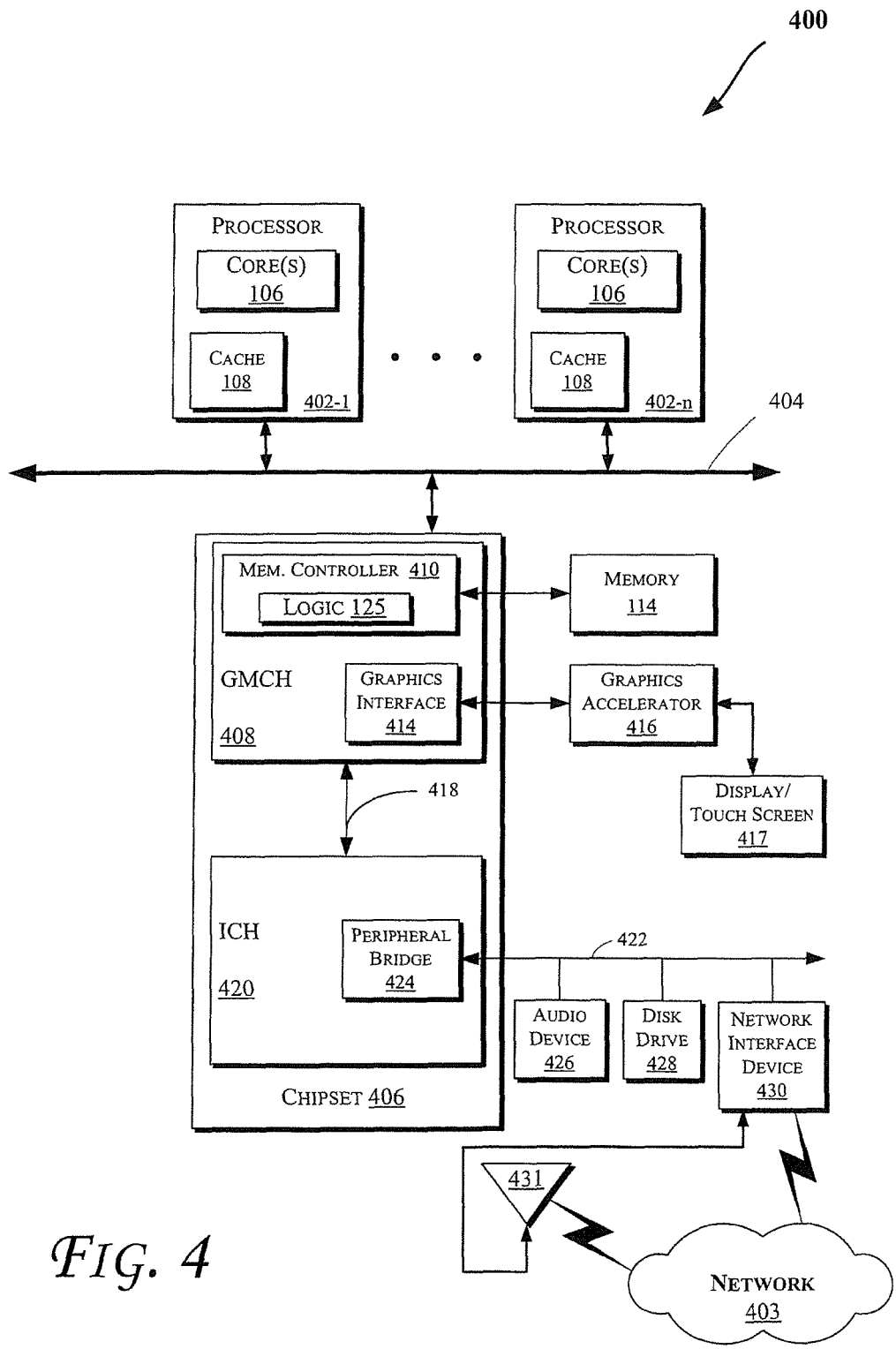

FIG. 4 illustrates a block diagram of a computing system 400 in accordance with an embodiment of the invention. The computing system 400 may include one or more central processing unit(s) (CPUs) 402 or processors that communicate via an interconnection network (or bus) 404. The processors 402 may include a general purpose processor, a network processor (that processes data communicated over a computer network 403), an application processor (such as those used in cell phones, smart phones, etc.), or other types of a processor (including a reduced instruction set computer (RISC) processor or a complex instruction set computer (CISC)). Various types of computer networks 403 may be utilized including wired (e.g., Ethernet, Gigabit, Fiber, etc.) or wireless networks (such as cellular, 3G (Third-Generation Cell-Phone Technology or 3rd Generation Wireless Format (UWCC)), 4G, Low Power Embedded (LPE), etc.). Moreover, the processors 602 may have a single or multiple core design. The processors 402 with a multiple core design may integrate different types of processor cores on the same integrated circuit (IC) die. Also, the processors 402 with a multiple core design may be implemented as symmetrical or asymmetrical multiprocessors.

In an embodiment, one or more of the processors 402 may be the same or similar to the processors 102 of FIG. 1. For example, one or more of the processors 402 may include one or more of the cores 106 and/or cache 108. Also, the operations discussed with reference to FIGS. 1-5 may be performed by one or more components of the system 400.

A chipset 406 may also communicate with the interconnection network 404. The chipset 406 may include a graphics and memory control hub (GMCH) 408. The GMCH 408 may include a memory controller 410 (which may be the same or similar to the memory controller 120 of FIG. 1 in an embodiment, e.g., including the logic 125) that communicates with the memory 114. The memory 114 may store data, including sequences of instructions that are executed by the CPU 402, or any other device included in the computing system 400. In one embodiment of the invention, the memory 114 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 604, such as multiple CPUs and/or multiple system memories.

The GMCH 408 may also include a graphics interface 414 that communicates with a graphics accelerator 416. In one embodiment of the invention, the graphics interface 414 may communicate with the graphics accelerator 416 via an accelerated graphics port (AGP). In an embodiment of the invention, a display 417 (such as a flat panel display, touch screen, etc.) may communicate with the graphics interface 414 through, for example, a signal converter that translates a digital representation of an image stored in a storage device such as video memory or system memory into display signals that are interpreted and displayed by the display. The display signals produced by the display device may pass through various control devices before being interpreted by and subsequently displayed on the display 417.

A hub interface 418 may allow the GMCH 408 and an input/output control hub (ICH) 420 to communicate. The ICH 420 may provide an interface to I/O devices that communicate with the computing system 400. The ICH 420 may communicate with a bus 422 through a peripheral bridge (or controller) 424, such as a peripheral component interconnect (PCI) bridge, a universal serial bus (USB) controller, or other types of peripheral bridges or controllers. The bridge 424 may provide a data path between the CPU 402 and peripheral devices. Other types of topologies may be utilized. Also, multiple buses may communicate with the ICH 620, e.g., through multiple bridges or controllers. Moreover, other peripherals in communication with the ICH 420 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 422 may communicate with an audio device 426, one or more disk drive(s) 428, and a network interface device 430 (which is in communication with the computer network 403, e.g., via a wired or wireless interface). As shown, the network interface device 430 may be coupled to an antenna 431 to wirelessly (e.g., via an Institute of Electrical and Electronics Engineers (IEEE) 802.11 interface (including IEEE 802.11a/b/g/n, etc.), cellular interface, 3G, 4G, LPE, etc.) communicate with the network 403. Other devices may communicate via the bus 422. Also, various components (such as the network interface device 430) may communicate with the GMCH 408 in some embodiments of the invention. In addition, the processor 402 and the GMCH 408 may be combined to form a single chip. Furthermore, the graphics accelerator 416 may be included within the GMCH 408 in other embodiments of the invention.

Furthermore, the computing system 400 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 628), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 5:
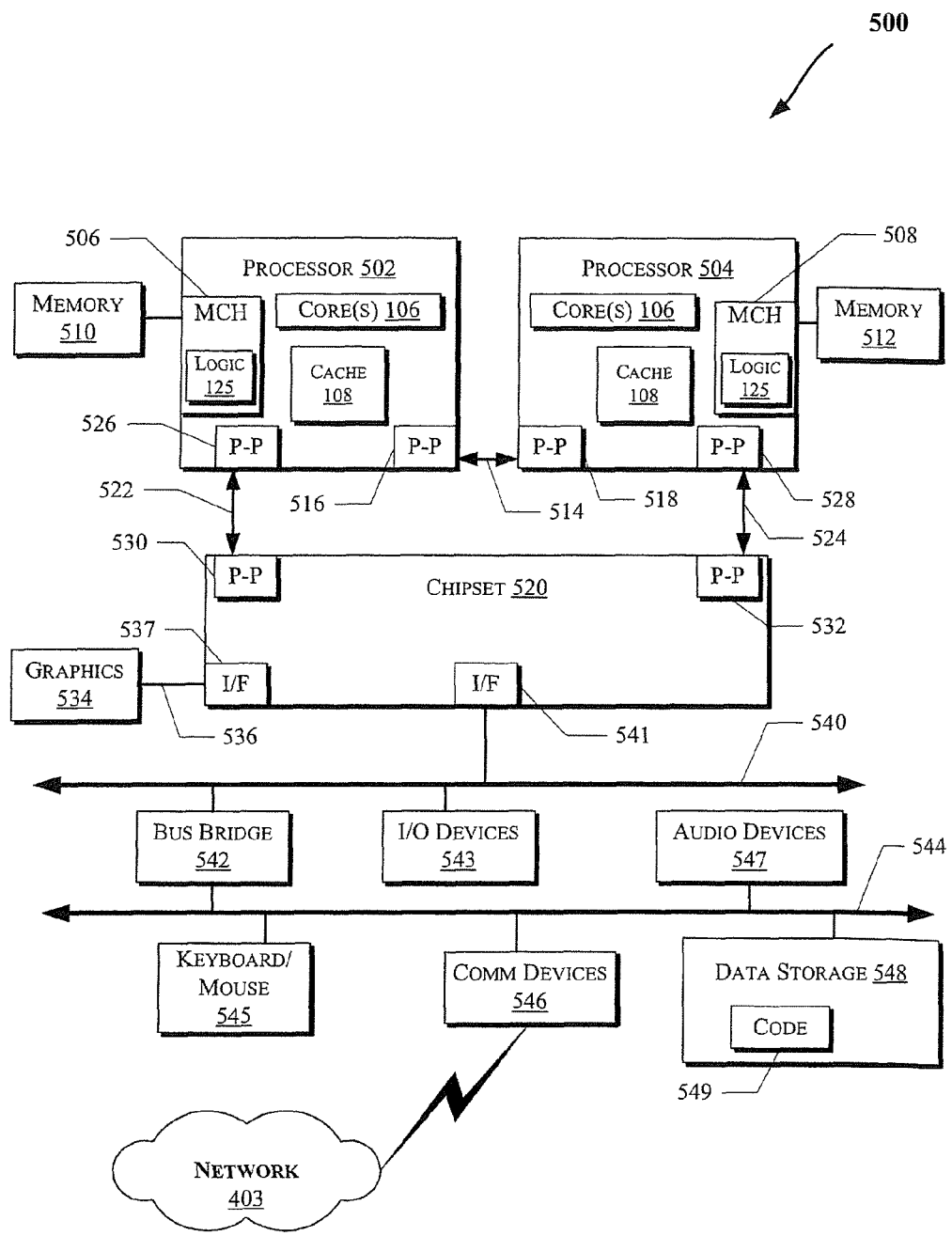

FIG. 5 illustrates a computing system 500 that is arranged in a point-to-point (PtP) configuration, according to an embodiment of the invention. In particular, FIG. 5 shows a system where processors, memory, and input/output devices are interconnected by a number of point-to-point interfaces. The operations discussed with reference to FIGS. 1-6 may be performed by one or more components of the system 700.

As illustrated in FIG. 5, the system 500 may include several processors, of which only two, processors 502 and 504 are shown for clarity. The processors 502 and 704 may each include a local memory controller hub (MCH) 506 and 508 to enable communication with memories 510 and 512. The memories 510 and/or 512 may store various data such as those discussed with reference to the memory 114 of FIGS. 1 and/or 4. Also, MCH 506 and 508 may include the memory controller 120 and/or logic 125 of FIG. 1 in some embodiments.

In an embodiment, the processors 502 and 504 may be one of the processors 402 discussed with reference to FIG. 4. The processors 502 and 504 may exchange data via a point-to-point (PtP) interface 514 using PtP interface circuits 516 and 518, respectively. Also, the processors 502 and 504 may each exchange data with a chipset 520 via individual PtP interfaces 522 and 524 using point-to-point interface circuits 526, 528, 730, and 532. The chipset 520 may further exchange data with a high-performance graphics circuit 534 via a high-performance graphics interface 536, e.g., using a PtP interface circuit 537. As discussed with reference to FIG. 4, the graphics interface 536 may be coupled to a display device (e.g., display 417) in some embodiments.

As shown in FIG. 5, one or more of the cores 106 and/or cache 108 of FIG. 1 may be located within the processors 502 and 504. Other embodiments of the invention, however, may exist in other circuits, logic units, or devices within the system 500 of FIG. 5. Furthermore, other embodiments of the invention may be distributed throughout several circuits, logic units, or devices illustrated in FIG. 5.

The chipset 520 may communicate with a bus 540 using a PtP interface circuit 541. The bus 540 may have one or more devices that communicate with it, such as a bus bridge 542 and I/O devices 543. Via a bus 544, the bus bridge 543 may communicate with other devices such as a keyboard/mouse 545, communication devices 546 (such as modems, network interface devices, or other communication devices that may communicate with the computer network 403, as discussed with reference to network interface device 430 for example, including via antenna 431), audio I/O device, and/or a data storage device 548. The data storage device 548 may store code 549 that may be executed by the processors 502 and/or 504.

In various embodiments of the invention, the operations discussed herein, e.g., with reference to FIGS. 1-5, may be implemented as hardware (e.g., circuitry), software, firmware, microcode, or combinations thereof, which may be provided as a computer program product, e.g., including a tangible (e.g., non-transitory) machine-readable or computer-readable medium having stored thereon instructions (or software procedures) used to program a computer to perform a process discussed herein. Also, the term "logic" may include, by way of example, software, hardware, or combinations of software and hardware. The machine-readable medium may include a storage device such as those discussed with respect to FIGS. 1-5.

Additionally, such tangible computer-readable media may be downloaded as a computer program product, wherein the program may be transferred from a remote computer (e.g., a server) to a requesting computer (e.g., a client) by way of data signals (such as in a carrier wave or other propagation medium) via a communication link (e.g., a bus, a modem, or a network connection).

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

An apparatus comprises Phase Change Memory with Switch (PCMS) controller logic to detect a bad block within a PCM device, retire the bad block and replace the bad block with a replacement block by assigning the address of the bad block to the replacement block. The controller logic moves the contents of the retired block to the replacement block prior to retiring the bad block.

What is claimed is:

1. An apparatus, comprising:
   an Address Indirect Table (AIT) to store information to translate between system memory addresses and write-in place non-volatile random access memory (NVRAM) addresses, said AIT to access said non-volatile random access memory at a level of granularity that is finer than a storage block level of granularity;
   a free block list including a list of blocks available to be used as replacement blocks;
   a system memory controller to interface to a multi-level system memory, said system memory controller and said AIT being architecturally between a processor last level cache and said multi-level system memory, said write-in place NVRAM residing at a level of said multi-level system memory;
   an NVRAM controller comprising logic to detect a bad block within the write-in place NVRAM device, retire the bad block, select a replacement block from the free block list, wherein blocks of the free block list are not available for use by software, and replace the bad block with a replacement block by remapping an address of the bad block to the replacement block using the AIT.

2. The apparatus of claim 1 wherein the logic is to move the contents of the retired block to the replacement block prior to retirement of the bad block.

3. The apparatus of claim 1 wherein the logic is to detect that the block is bad upon detection that a number of Error Correcting Code (ECC) errors has exceeded a predetermined threshold.

4. The apparatus of claim 1 wherein the logic is to detects that the block is bad upon detecting a hard failure at the write-in place NVRAM device.

5. The apparatus of claim 1 wherein the logic is to detects that the block is bad block upon detecting one or more error conditions at the write-in place NVRAM device.

6. The apparatus of claim 5 wherein the logic is to retire the write-in place NVRAM device upon a determination that the number of bad blocks has exceeded a predetermined threshold.

7. The apparatus of claim 1 wherein the logic is to determine whether a number of bad blocks in the write-in place NVRAM device has exceeded a predetermined threshold.

8. The apparatus of claim 1 wherein the NVRAM is any of:
   a phase change memory;
   ferroelectric memory.

9. A system comprising:
   a multi-level system memory that is architecturally beneath a last level processor cache;
   a write-in place non-volatile random access memory (NVRAM) device residing at a level of said multi-level system memory;
   an Address Indirect Table (AIT) to store information to translate between system memory addresses and NVRAM addresses at a level of granularity that is finer than a storage block level of granularity, said AIT architecturally residing beneath a last level processor cache and above said multi-level system memory;

a free block list including a list of blocks available to be used as replacement blocks; and controller logic to detect a bad block within the write-in place NVRAM device, retire the bad block, select a replacement block from the free block list, wherein blocks of the free block list are not available for use by software, and replace the bad block with a replacement block by remapping an address of the bad block to the replacement block using the AIT.

10. The system of claim 9 wherein the controller logic is to move the contents of the bad block to the replacement block prior to retiring the bad block.

11. The system of claim 9 wherein the controller logic is to detect that the block is bad upon detection that a number of Error Correcting Code (ECC) errors has exceeded a predetermined threshold.

12. The system of claim 9 wherein the controller logic is to detect that the block is bad upon detection of a hard failure at the write-in place NVRAM device.

13. The system of claim 9 wherein the controller logic is to detect that the block is a bad block upon detection of one or more error conditions at the write-in place NVRAM device.

14. The system of claim 9 wherein the controller logic is to determine whether a number of bad blocks in the write-in place NVRAM device has exceeded a predetermined threshold.

15. The system of claim 14 wherein the controller logic is to retire the write-in place NVRAM device upon determination that the number of bad blocks has exceeded the predetermined threshold.

16. The apparatus of claim 9 wherein the NVRAM is any of:

a phase change memory;

ferroelectric memory.

17. A method, comprising:

accessing a multi-level system memory comprising a first level and a second level, said second level lower than said first level in a hierarchy of said multi-level system memory, said second level comprising non volatile random access memory (NVRAM) said accessing further comprising accessing an Address Indirect Table (AIT) to translate between system memory addresses and addresses for said NVRAM of said second level of said multi-level system memory, wherein said AIT translates between system memory addresses and addresses for said NVRAM at a level of granularity that is finer than a storage block granularity, said AIT being accessed after a last level processor cache is accessed and before said multi-level system memory is accessed;

maintaining a free block list including a list of blocks available within said NVRAM of said second level of said multi-level system memory to be used as replacement blocks;

detecting a bad block within a memory device of the multi-level system memory, the memory device being a component of said NVRAM of said second level of said multi-level system memory;

retiring the bad block;

selecting a replacement block from the free block list wherein blocks of the free block list are not available for use by software; and, replacing the bad block with a replacement block by remapping an address of the bad block to the replacement block using the AIT; and, causing retirement of a DIMM card comprising the memory device if a number of bad blocks are detected on the DIMM card.

18. The method of claim 17 wherein the NVRAM of said second level of said multi-level system memory is any of:

a phase change memory;

ferroelectric memory.

19. The method of claim 17 further comprising moving the contents of the bad block to the replacement block prior to retiring the bad block.

* * * * *